United States Patent
Koduri (10) Patent No.: US 10,658,278 B2
(45) Date of Patent: May 19, 2020

(54) ELECTRICAL DEVICE TERMINAL FINISHING

(71) Applicant: Texas Instruments Incorporated, Dallas, TX (US)

(72) Inventor: Sreenivasan K Koduri, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/104,049

(22) Filed: Aug. 16, 2018

(65) Prior Publication Data

US 2020/0058576 A1 Feb. 20, 2020

(51) Int. Cl.
*H01L 23/495* (2006.01)
*H01L 21/56* (2006.01)
*H01L 23/31* (2006.01)
*H01L 21/48* (2006.01)
*H01L 23/00* (2006.01)

(52) U.S. Cl.
CPC .... *H01L 23/49582* (2013.01); *H01L 21/4825* (2013.01); *H01L 21/561* (2013.01); *H01L 23/3107* (2013.01); *H01L 24/48* (2013.01); *H01L 2224/48175* (2013.01)

(58) Field of Classification Search
CPC ............. H01L 21/4821; H01L 21/4825; H01L 23/49579; H01L 23/59582; H01L 24/48; H01L 2224/48175
See application file for complete search history.

(56) References Cited

U.S. PATENT DOCUMENTS

| 4,707,724 A * | 11/1987 | Suzuki .............. H01L 23/49582 257/677 |
| 5,329,158 A * | 7/1994 | Lin ....................... H05K 3/3426 257/666 |
| 2009/0146280 A1* | 6/2009 | Shimazaki ............... C25D 5/12 257/676 |
| 2014/0175628 A1* | 6/2014 | Pan ......................... H01L 24/37 257/676 |

* cited by examiner

*Primary Examiner* — David C Spalla
(74) *Attorney, Agent, or Firm* — Dawn Jos; Charles A. Brill; Frank D. Cimino (57) ABSTRACT

In described examples, a terminal (e.g., a conductive terminal) includes a base material, a plating stack and a solder finish. The base material can be a metal, such as copper. The plating stack is arranged on a surface of the base material, and includes breaks in the plating stack. The breaks in the plating stack extend from a first surface of the plating stack to a second surface of the plating stack adjacent to the surface of the base material. The solder finish is coated over the breaks in the plating stack.

20 Claims, 4 Drawing Sheets

ELECTRICAL DEVICE TERMINAL FINISHING

BACKGROUND

Electrical components and semiconductor devices can be covered (e.g., encapsulated) in insulating packages through which conductive terminals extend. Such conductive terminals (leads) can be arranged as gull-wing or through-hole pins, for example. However, reactive species in the environment of such semiconductor devices can react with a metallurgy of the leads, which can lead to failure of the affected leads.

SUMMARY

In described examples, a terminal (e.g., a conductive terminal of an electrical device) includes a base material, a plating stack and a solder finish. The base material can be a metal, such as copper. The plating stack (which can include layers of nickel and noble metals) is arranged on a surface of the base material, and includes breaks in the plating stack. The breaks in the plating stack extend from a first surface of the plating stack to a second surface of the plating stack adjacent to the surface of the base material. The solder finish is coated over the breaks in the plating stack.

DETAILED DESCRIPTION

Described herein are example leads for conducting electrical signals (including power) to and from a covered integrated circuit. The described example leads can include finishes resistant to corrosive (and otherwise reactive) agents present in at least some harsh industrial environments. The described finishes can impede the rate of corrosion and metal migration that can occur with materials used to manufacture the conductive terminals (leads) of semiconductors devices. Applications of the methods and apparatus described herein can be applied to active electrical devices including semiconductors (e.g., transistors and integrated circuits) and/or passive electrical devices (e.g., coils, capacitors, and resistors).

Gull-wing and through-hole packages can be used for packaging semiconductor devices for use in industrial applications. Such packages can include relatively long and formed leads (e.g., terminals or pins), which can act as stress-absorbing (e.g., spring-like) structures when mounted on a substrate (e.g., system board). To increase board-level reliability, the leaded packages (e.g., packages having leads) can include leads that are initially formed using a copper (Cu) alloy, and the copper leads are subsequently protected with a solderable finish. The finish can include tin (Sn) and/or a stack of nickel (Ni), palladium (Pd) and gold (Au).

For example, the copper leads can be finished by depositing a protective surface onto and around an outer surface of the lead. In a first example, the original surfaces of the base material of the leads can be finished by plating tin (Sn) onto the outer surfaces of the lead. In a second example, the original surfaces of the leads can be successively plated with a stack of elements (e.g., elements optionally including alloys or compounds) such as nickel (Ni), palladium (Pd) and gold (Au). The Ni—Pd—Au stack is suited for forming robust solder joints, for example.

However, the use of tin (Sn) and nickel-palladium-gold (Ni—Pd—Au) stacks in lead-frame manufacturing can lead to a decline in reliability over time. In the first example, the tin can gradually form dendrites (e.g., "whisker"), which can potentially short-circuit adjacent leads. In the second example, mechanical processing of the leads (e.g., cutting, bending or otherwise forming the shape of a lead of a lead-frame) can expose previously covered (e.g., protected) portions of the underlying surface of the base material of the original lead. (The term "portion" can mean an entire portion, or a portion that is less than the entire portion.) When the original base material includes reactive components (such as copper—Cu), the re-exposed surface) can corrode in response to exposure to environmental reactants.

The example finished leads described herein can include an initial Ni—Pd—Au plating stack as a finish. However, mechanical processing of the leads (e.g., of a pre-plated lead-frame) can result in breaks in the plating stack (such as described hereinbelow with respect to FIG. 1A). The breaks in the plating stack degrade the protective finish, such that corrosion of the underlying base material of the lead can be initiated and then progressively sustained (e.g., which can reduce the reliability of a device having breaks in the plating stack). The potential for corrosion can be can be reduced by finishing (e.g., coating over) such breaks in the plating stack with solder, such that the exposed underlying surfaces of the base material of the lead are once again covered (e.g., protected). The leads can be finished by plating, dipping, splashing, drizzling, bathing, immersing, coating, vapor-depositing, covering or otherwise encapsulating the exposed surfaces of the base material of the lead with solder. (Plating processes can include processes for deposition of metallic layers other than electroplating; likewise coatings of products and devices described as being "plated" can be formed by processes other than electroplating.) The solder can include corrosion-resistant and eutectic substances, such as tin.

Figure 1A:
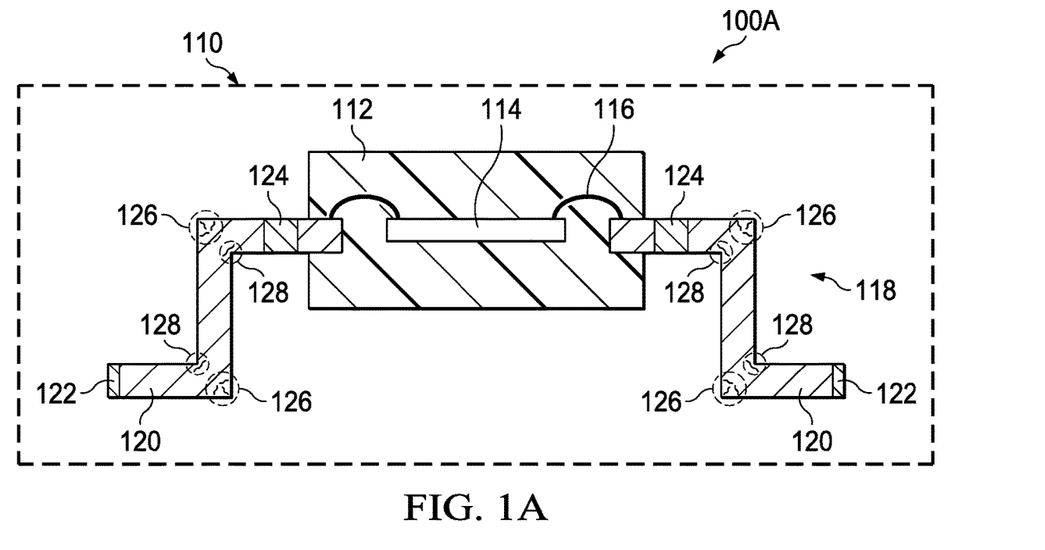
FIG. 1A is a cross-sectional diagram of an example electrical device that includes terminals with breaks in a finish for sealing the terminals.

FIG. 1A is a cross-sectional diagram of an example electrical device 100A that includes terminals with breaks in a finish for sealing the terminals. The device 100A includes a package 112 that encapsulates an integrated circuit 114, bonding wires 116 and a proximal portion of each terminal 118. The bonding wires 116 electrically couple the covered integrated circuit 114 to the external devices via exposed portions of the terminals 118. The terminals 118, which are pre-plated with a finish 120, which is formed as a plating stack (e.g., see FIG. 2A) of different metals for reducing corrosive effects on the terminals 118.

The device 100A is shown in an example process configuration 110 in which the terminals 118 (which were initially bound together in a lead-frame assembly) have been bent into a gull-wing shape (when viewed in cross-section, as shown) and cut. Bending the terminals can result in tension-formed breaks 126 in the finish 120 of convex portions of the bent terminals 118, and can also result in compression-formed breaks 128 in the finish 120 of concave portions of the bed terminals 118. Accordingly, the tension-formed breaks 126 and the compression-formed breaks 128 are adjacent to (e.g., occurring within or along) the bent portion of the terminal.

Further, cutting the terminals 118 (e.g., to separate the terminals 118 from a leadframe) can result in an end-cut break 122 in the finish 120 in distal portions of the terminals 118. For example, the distal portions of the terminals 188 can be attached to an outer portion of a leadframe (e.g., in which the terminals 188 are initially captivated for ease of handling and maintaining dimensional tolerances). The pre-plating with a finish 120 can be performed on the leadframe (which includes the terminals 188) as a unit. The cutting (e.g., severing) of a distal portion (e.g., "end") of a terminal cuts through (e.g., "breaks") the pre-plated finish 120, such that the base metal of the terminals 118 is (re-) exposed and subject to corrosion via the end-cut break 122.

In addition, cutting away a lead-frame dam-bar can result in a dam-bar break 124 in the finish 120, where the dam-bar break 124 is located at proximal portions of the terminals 118. For example, the proximal portions of the terminals 188 can be attached to an inner portion of a leadframe (e.g., at interposed dam-bars, not shown, by which the terminals are initially captivated at a proximal end for ease of handling and maintaining dimensional tolerances). The pre-plating with a finish 120 can be performed on the leadframe as a unit. The dam-bars can be removed by cutting (e.g., along a plane parallel to the shown cross-sectional plane of the device 100A) each dam-bar from between adjacent terminals. Cutting away a dam-bar cuts through the pre-plated finish 120, such that a dam-bar break 124 exposes a proximal portion (e.g., "shoulder") of a terminal 188 where the pre-plated finish 120 is cut though, and such that the base material of the terminal 188 is (re-) exposed at the former intersections (e.g., at the dam-bar breaks 124) between the terminals 188 and respective formerly interposed dam-bars. The exposed base material at each dam-bar break 124 is subject to corrosion. The breaks (e.g., end-cut breaks 122, dam-bar breaks 124, tension-formed breaks 126 and compression-formed breaks 128) in the finish 120 are processed for further finishing (e.g., for protection against corrosion) as described hereinbelow.

Figure 1B:
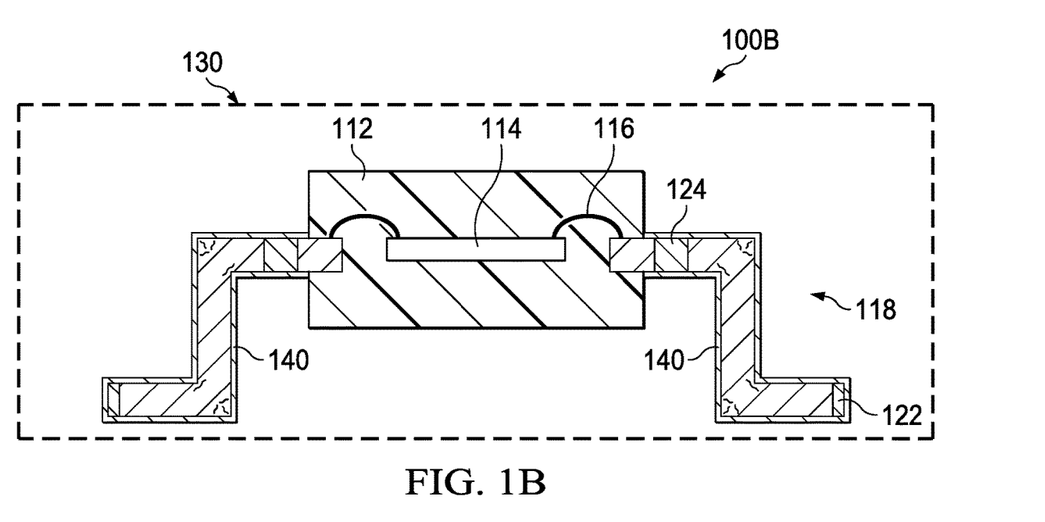
FIG. 1B is a cross-sectional diagram of an example electrical device that includes a flux coating for covering terminals with breaks in a finish for sealing the terminals.

FIG. 1B is a cross-sectional diagram of an example electrical device 100B that includes a flux coating for covering terminals having breaks in a finish for sealing the terminals. The device 100B is shown in an example process configuration 130 in which the terminals 118 (which have breaks in the finish 120 as a result of bending and cutting the terminals 130) have been covered with the flux coating 140. The flux coating 140 is arranged for penetrating and/or coating the breaks 122, 124, 126 and 128.

The flux coating 140 can be applied, for example, by handling the devices 100C with a pick-and-place machine (or other conveyance, such as a conveyer belt) arranged to dip each side of the device 100B into a pool of solder flux (e.g., liquid solder flux). Each side of the device 100B having terminals 180 can be successively dipped (e.g., immersed) into the pool of solder flux, such that the breaks 122, 124, 126 and 128 are coated with the flux coating 140. As described hereinbelow with respect to FIG. 1C, the flux coating 140 is arranged to promote the surface wetting and adhesion of a finish (e.g., molten solder) applied to cover and seal exposed portions (e.g., which are exposed through the breaks 122, 124, 126 and 128) of the base material (e.g., copper) of the terminals 118.

Figure 1C:
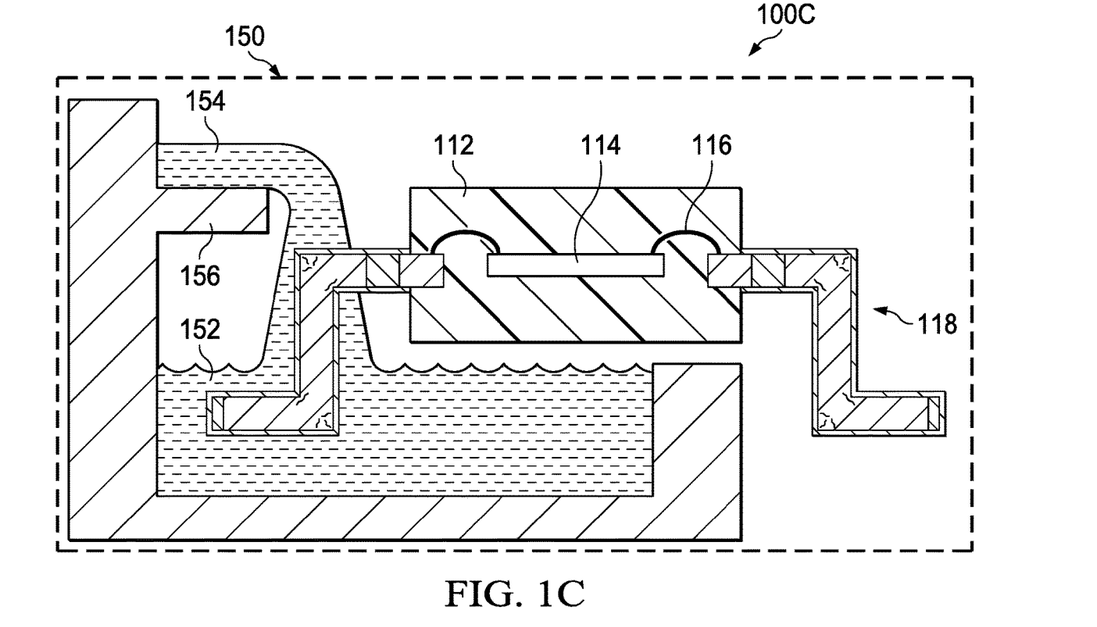
FIG. 1C is a cross-sectional diagram of example terminals of the electrical device being exposed to molten solder.
Figure 1D:
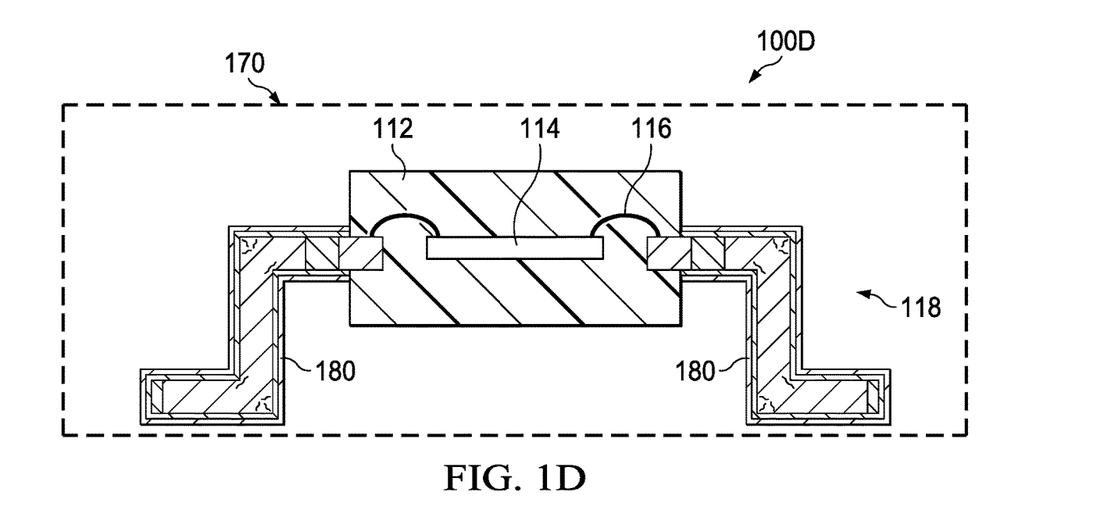
FIG. 1D is a cross-sectional diagram of an example electrical device including a solder finish for covering the terminals having breaks in a previously applied finish for sealing the terminals.

FIG. 1C is a cross-sectional diagram of example terminals of the electrical device 100C being exposed to molten solder. The molten solder replaces (and/or coats portions of) the flux coating as the molten solder wets the surface of the terminals 118 with a solder finish for sealing the terminals. The solder finish 180 (e.g., as shown in FIG. 1D) coats and seals breaks in the finish 120.

The device 100C is shown in an example process configuration 150 in which terminals 118 (which have breaks in the finish 120 previously coated with a flux coating 140) are exposed to a solder (e.g., molten solder) alloy for forming the solder finish 180. The terminals 118 can be finished by plating, dipping, splashing, drizzling, bathing, immersing, coating, vapor-depositing or otherwise encapsulating the exposed base material of the terminals 118. The solder finish can be an alloy, which—in addition to the sole inclusion of tin—can include eutectic combinations of elements such as: tin and copper; and tin, copper and silver.

In at least one example, the device 100C is "baked" (e.g., exposed to elevated temperatures for a period of time sufficient to remove moisture and other contaminants). Exposing the device 100C to elevated temperatures before applying a solder finish lessens the probability of delamination of the solder finish to be applied.

In the example, a pick-and-place machine (or other conveyance, such as a conveyer belt) is arranged to successively dip each side of the device 100C into a pool 152 of solder (e.g., molten solder). During each dip, solder is applied for covering (e.g., directly or indirectly cover) any base material of the terminals 118 previously exposed by the breaks 122, 124, 126 and 128. The length of the dip of the device 100C into the pool 152 of solder can be around 2 through 5 seconds, which can provide sufficient time for surface wetting of the terminals 118 while limiting the heating of the device 100C by the molten solder.

The solder can be also be applied by other techniques, such as transporting the devices on a conveyer belt, and pouring (e.g., from a shelf 156) a stream 154 of molten solder over surfaces of the terminals 118 covered by the solder flux 140. The terminals 118 are immersed (e.g., temporarily immersed) under the stream 154 of molten solder, where some of the solder adheres (e.g., as helped by the solder flux coating) to the exposed surfaces of the terminal 118 (which are coated with the solder flux). The limited duration of time (e.g., the time in which the solder immerses the terminals 118) limits the heat transferred to the covered integrated circuit, for example. The solder that adheres to the treated surfaces (e.g., where the treated surfaces are terminal surfaces immersed in a solder stream or bath) fills-in the breaks in the plated stack, which protects the base material of the terminals 118 against reactants present in the environment in which the solder-coated terminals 118 is placed. The herein-described methods for applying solder as a finish can be combined, such that the breaks 122, 124, 126 and 128 are coated with the protective solder finish (e.g., as described hereinbelow with respect to FIG. 1D).

FIG. 1D is a cross-sectional diagram of an example electrical device 100D including a solder finish for covering terminals having breaks in a previously applied finish for sealing the terminals. The device 100D is shown in an example configuration 170 in which terminals 118 previously coated with a flux coating 140 are covered by a solder finish 180. The solder finish 180 covers any exposed base material of the terminals 118 with a durable finish, which is relatively easily soldered, provides reliable adhesion when soldered, and protects the base material of the terminals 118 against chemical reactants present in some harsh industrial environments.

Figure 2A:
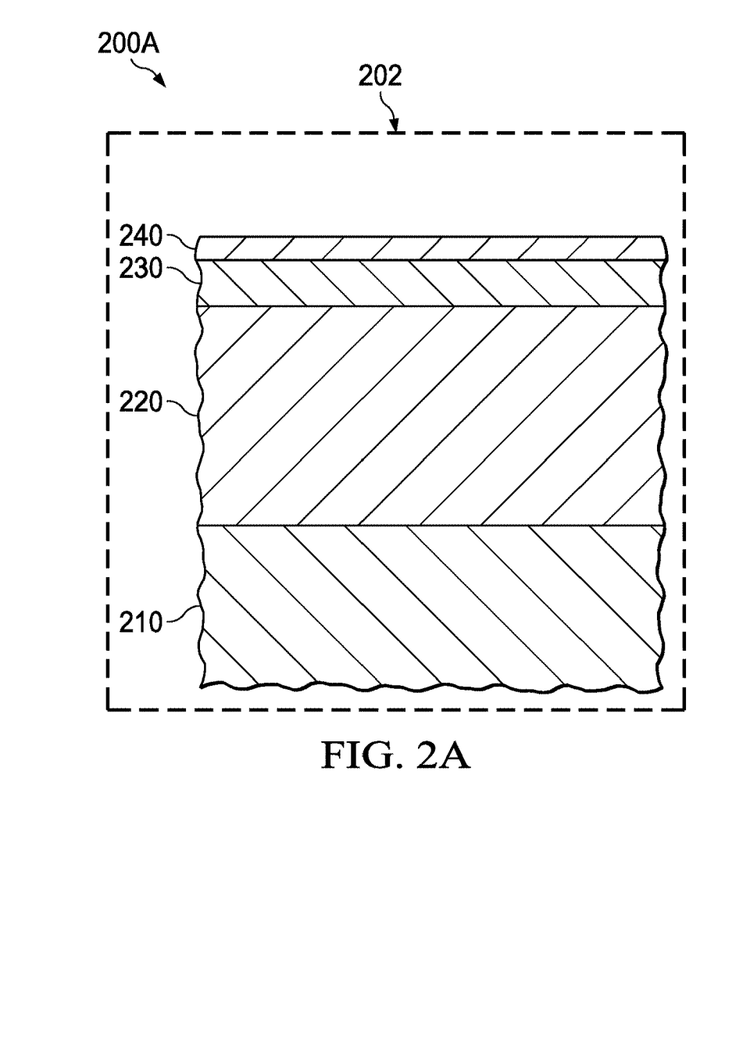
FIG. 2A is a cross-sectional diagram of an example initial stack coating a base material of the terminals.

FIG. 2A is a cross-sectional diagram of an example initial stack 200A coating a base material of the terminals. The stack 200A is shown in an example configuration 202 in which a portion of a base material 210 of a terminal is covered by the layers of the stack 200A. The stack 200A can be formed (e.g., by plating layers of dissimilar materials) on various terminals before cutting and bending of terminals included in a lead-frame.

A first layer 220 of the stack includes a barrier metal, such as nickel (Ni). The nickel separates the base material (e.g., copper) from a later-applied solder finish, which can include tin. The barrier metal reduces intermetallic reactions between (for example) tin (in the solder finish) and copper (in the base material 210), where such intermetallic reactions can induce failures caused by dendrite growth, migration of metal and formation of voids. The first layer can be plated over the base material 210 to a depth of around 20-80 microns, for example.

A second layer 230 of the stack includes a bonding metal, such as palladium (Pd). Wire bonding to palladium can produce more secure bonds as compared against wire bonding to nickel or silver (Ag). Accordingly, bonding to a noble metal such as palladium can increase the bonding adhesion of a wire bonded to the terminal. The second layer 230 can be plated over the first layer 220 to a depth of around 0.2-4.0 microns, for example.

A third layer 240 of the stack 200A includes a noble metal, such as gold (Au). The third layer 240 can include other metals (such as silver—Ag), such that the third layer 240 is a metal alloy. The third layer 240 provides protection against environmental reactants, which reduces chemical reactions with environmental reactants. The third layer 240 can be plated over the second layer 230 to a depth of around 30-90 angstroms. As described hereinabove, the third layer can be broken and/or cut through in subsequent processing steps, which can expose the second layer 230, the first layer 220 and the base material 210 to environmental reactants. As described hereinbelow with reference to FIG. 2B, the breaks (e.g., fissures or cuts) in the stack 200A that extend from the third layer 240 to the base material 210 can be covered (or otherwise sealed) by a solder finish.

Figure 2B:
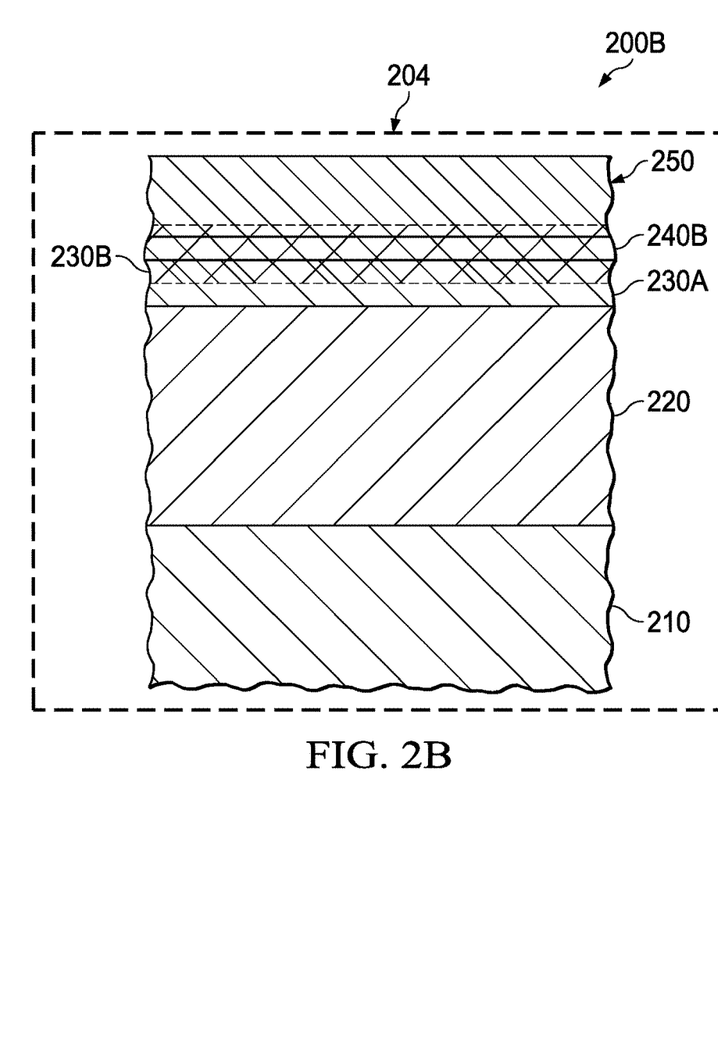
FIG. 2B is a cross-sectional diagram of an example stack including a solder finish for coating underlying base material of the terminals.

FIG. 2B is a cross-sectional diagram of an example stack 200B including a solder finish for coating underlying base material of the terminals. The stack 200B is shown in an example configuration 204 in which a portion of the initial stack 200A is covered by a solder finish 250. The stack 200B can be formed (e.g., plated) on various terminals after cutting and bending of terminals plated with a stack 200A while captivated by a lead-frame assembly.

In an example process for forming the stack 200B, molten solder to the stack 202 is applied to the third layer 240 by dipping compromised (e.g., have breaks in the stack 200A) into a solder bath. The molten solder is capable of melting the third layer 240 (e.g., to form a mixed layer 240B of solder and gold) as well as melting some or all of the second layer 230 (e.g., to form a mixed layer 230B of solder and palladium, and to optionally leave an optional residual second layer 230A of palladium). Accordingly, a solder finish 250 coats (e.g., covers and/or seals) any breaks that compromise the stack 200A (e.g., where the breaks occur as a result of manufacturing processes such as cutting and/or bending the terminals, and where the breaks caused by the manufacturing processes would otherwise allow environmental reactants to migrate to the base material 210).

In an example process, all of the gold—as well as all or some of the palladium—is melted, such that the melted portions of the gold and/or palladium are either dispersed into a solder bath or remain (as dispersed elements) as portions of layers 240B and 230B when cooled. (Some portions of the gold and palladium are dispersed into the solder bath, and can be reclaimed as individual elements by processing the solder in the solder bath.

Figure 3:
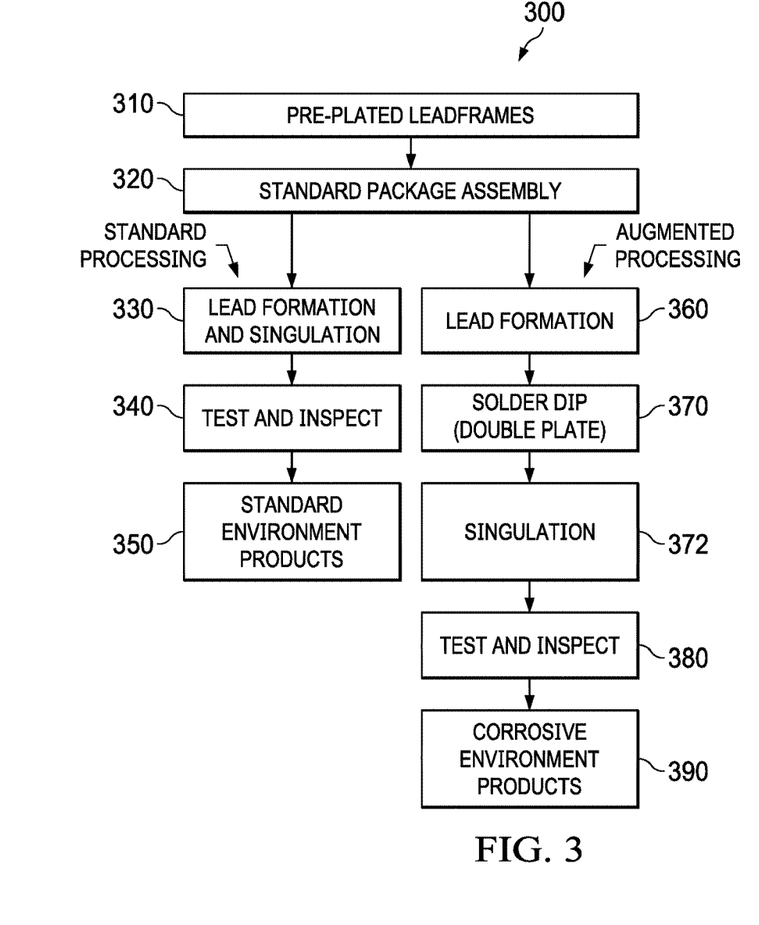
FIG. 3 is a flow diagram of an example method for finishing terminals of electric devices.

FIG. 3 is a flow diagram of an example method for finishing terminals of electric devices. Flow 300 can begin with operation 310.

In operation 310, pre-plated leadframes are formed or received. The pre-plating of the leadframes can include one or more layers of plated metals. The pre-plating of the leadframes can include a first finish, such as plating stack 200A, which includes three layers of metal plated over a base material of a terminal. In various examples, the plating stack 200A does not include tin (Sn, in which intermetallic reactions between Sn of a plating and Cu as a base material can cause dendrite formation) or lead (Pb, which can be an environmental hazard). Flow 300 continues at operation 320.

In operation 320, the pre-plated leadframes are electrically coupled (e.g., by wire bonding) to at least one integrated circuit, each of which is partially covered by an encapsulate (such as a molded plastic or a ceramic package). The encapsulate is for encapsulating (e.g., surrounding and protecting) each integrated circuit (along with the associated bonding wires and proximal portions of terminals) that is captivated by a pre-plated leadframe. The pre-plated leadframe and the integrated circuit(s) captivated thereby form a standard package assembly. The standard package assembly can be a molded leadframe assembly (e.g., which can be mechanically attached to other integrated circuits by the same, in-common, leadframe).

The standard package assembly can be further processed using standard processing (e.g., for use in standard environments) or augmented processing (e.g., for use in harsh environments or for extended product life). The bifurcation of the example method for finishing terminals electrical devices (e.g., in flow 300) can save manufacturing costs (for example) by allowing larger batches of standard packages to be formed in operations 310 and 320, while either standard processing or augmented processing can be subsequently and selectively performed (for example) on the basis of market conditions (such as unit demand and efficient batch quantities). Flow 300 continues at operation 330 for standard processing, while flow 300 continues at operation 360 for augmented processing.

In operation 330, the leads are re-formed (e.g., bent) and severed (e.g., cut) from the leadframe to form individual terminals and to remove the dam-bar of the leadframe (which can dam an outwards flow of injected encapsulate during encapsulation). As described hereinabove at least with respect to FIG. 1A, breaks (e.g., openings, fissures, windows, cuts and other discontinuities) are formed in the first finish (e.g., pre-plating) of the leads during lead formation (e.g., during bending and/or cutting). Also in operation 330, the standard package assembly can be singulated from the leadframe (e.g., to form an individual packaged integrated circuit). Flow 300 continues at operation 340.

In operation 340, the singulated assembly can be electrically tested and visually inspected. Defective units can be culled and acceptable units can be passed for further processing. Flow 300 continues at operation 350.

In operation 350, the accepted units can be packaged for shipping as products intended for standard use (e.g., in a standard environment).

Augmented processing of standard package assemblies (e.g., for use in harsh environments and/or for extending a product life) is described, beginning with reference to operation 360.

In operation 360, the leads of the standard package assembly are re-formed (e.g., bent) and severed (e.g., cut) from the leadframe to form individual terminals (e.g., pins) and to remove the dam-bar of the leadframe. Flow 300 continues at operation 370.

In operation 370, a second finish (e.g., second plating) is applied to the individual terminals (which can contain breaks in the first finish of the pre-plated terminals) of the package assembly. For example, exposed portions of the base material of the leadframe can be coated with a flux coating in preparation for applying the solder finish. The solder finish can be applied by dipping the flux-coated individual terminals into a pool of molten solder, such that solder is applied for covering (e.g., directly or indirectly covering) any exposed base material of the terminals.

Dendrite formation is reduced by applying the solder (which contains Sn) in a dipping process, as compared against the dendrite formation resulting from a process for electroplating the Sn onto the exposed base material (e.g., Cu). The application of the second finish over the first finish forms an augmented layered protective stack, which can also be referred to as a "double plating" and/or a "double stack."

The applied solder finish improves the reliability of solder joints (e.g., such as formed in surface mounting of the solder-finished terminals to a printed circuit board. For example, the solder finish improves wetting of flowing solder between components during the formation of the solder joints. Because of the improved wetting of the flowing solder, the appearance of the formed solder joints is more uniform, which facilitates more accurate inspections of the solder joints. Additionally, the formation of Kirkendall voids in the formed solder joints is reduced because of the pre-plated finish (e.g., first finish) on the terminals, which separates the solder finish (e.g., a second finish) from the underlying base layer (e.g., which can include copper). Flow 300 continues at operation 380.

In operation 372, the standard package assembly can be singulated from the leadframe. Singulation separates multiple packaged integrated circuits into individual packaged integrated circuits. For example, each individual integrated circuit is separated from a common leadframe by severing an exposed portion of the leadframe. The singulation of the standard package assembly after the solder finishing of operation 370 cuts away the pre-plated stack of the leadframe and exposes the base material (e.g., Cu) of the retained portion of the leadframe (e.g., the portion of the leadframe adjacent to the encapsulate). Flow 300 continues at operation 380.

In operation 380, the singulated assembly can be electrically tested and visually inspected. The testing can include temperature cycling, autoclaving, and determining moisture sensitivity levels of accepted units. Defective units can be culled, whereas acceptable units can be passed for further processing (e.g., in operation 390). Further, process parameters for the operation 370 (such as the angle of dip, dip time and temperature of the solder pool and the quality of the solder in the solder pool) can be adjusted in response to inspection results to improve solder coverage for subsequently dipped units). Additionally, components having double-plated terminals (e.g., having a second finish as applied in operation 370) can more readily pass mixed gas (e.g., corrosive gas) tests, which increases the range of applications of the components using the double-plated terminals. Flow 300 continues at operation 390.

In operation 390, the accepted units can be packaged for shipping as products for operating over extended lifetimes in a wide range of operating environments (e.g., for operating in wider range of conditions than standard operating environments). For example, the products produced with the augmented processing (e.g., which can include the solder deposition of operation 370) have longer life-spans for a given environment than do products produced with the standard processing (e.g., via operation 330, 340 and 350). Further, when the given operating environment includes corrosive reactants, the double plating increases the lifespans of products including products processed with the augmented processing (e.g., which can include the solder deposition of operation 370).

Figure 4:
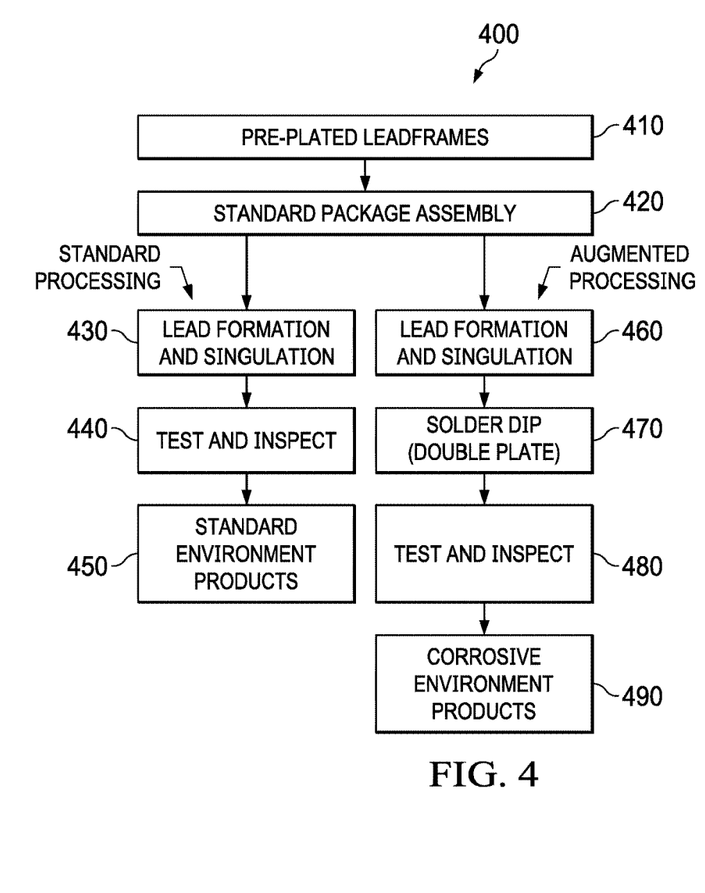
FIG. 4 is a flow diagram of an alternate example method for finishing terminals of electric devices.

FIG. 4 is a flow diagram of an alternate example method for finishing terminals of electric devices. As described hereinbelow, singulation (e.g., in operation 460) can be performed before performing a solder deposition (e.g., in operation 470). Flow 400 can begin with operation 410.

In operation 410, pre-plated leadframes are formed or received. The pre-plating of the leadframes can include one or more layers of plated metals. The pre-plating of the leadframes can include a first finish, such as stack 200A, which includes three layers of metal plated over a base material of a terminal. Flow 400 continues at operation 420.

In operation 420, the pre-plated leadframes are electrically coupled to an integrated circuit die and are partially covered by an encapsulate, which forms a standard package assembly. The standard package assembly can be further processed using standard processing or augmented processing. Flow 400 continues at operation 430 for standard processing of the standard package assembly, while flow 400 continues at operation 460 for augmented processing of the standard package assembly.

In operation 430, the leads are re-formed and severed from the leadframe to form individual terminals and to remove the dam-bar of the leadframe. Also in operation 430, the standard package assembly is singulated from the leadframe. As described hereinabove at least with respect to FIG. 1A, breaks are formed in the first finish (e.g., a pre-plated stack) of the leads during lead formation. Likewise, a non-terminal portion of the base material of the leadframe is exposed during singulation. Flow 400 continues at operation 440.

In operation 440, the singulated assembly can be electrically tested and visually inspected. Defective units can be culled and acceptable units can be passed for further processing. Further, units meeting selected inspection standards (such as degree of breaks in the first finish or reliability of operation at high temperatures or clock speeds), can be selected for augmented processing (e.g., starting with operation 470, described hereinbelow). Flow 400 continues at operation 450.

In operation 450, the accepted units can be packaged for shipping as products for standard use.

Augmented processing of standard package assemblies (e.g., for use in harsh environments and/or for extending a product life) is described, beginning with reference to operation 460.

In operation 460, the leads of the standard package assembly are re-formed and severed from the leadframe to form individual terminals and to remove the dam-bar of the leadframe. The standard package assembly is also singulated, which cuts through the pre-plated stack of the leadframe and exposes the base material (e.g., Cu) of the retained portion of the leadframe. Flow 400 continues at operation 470.

In operation 470, a second finish is applied to the individual terminals of the package assembly. For example, exposed portions of the base material of the leadframe can be coated with a flux coating in preparation for applying the solder finish. The solder finish can be applied by dipping the flux-coated individual terminals into a pool of molten solder, such that solder is applied for covering any exposed base material of the terminals. The solder can be also be applied by other techniques suitable for applying a solder finish (and, for example, avoiding potentially harmful exposure of the encapsulate to heat). The application of the second finish over the first finish forms an augmented layered protective stack, which can also be referred to as a "double plating" and/or a "double stack."

The application of the solder finish to the base material exposed by the singulation cut) forms an Sn—Cu contact region. (The base material exposed by the singulation cut is in a location different from the exposed base layer of the terminals, which are exposed by severing the terminals from the leadframe. Dendrite formation can occur by intermetallic reactions at the SN—Cu contact region, although such dendrite formation occurs in the location different from the terminals (such that the terminals are not "shorted" by the dendrite formation of the SN—Cu contact region formed by applying solder finish to the base layer exposed by the singulation cut. Dendrite formation can be reduced by applying the solder (which contains Sn) in a dipping process, as compared against electroplating the Sn onto the exposed base material (e.g., Cu).

Further, the area of exposed base material in the terminals (to be covered with the solder finish) is orders of magnitude smaller than the Sn—Cu contact region formed by double-plating the base material exposed by the singulation cut. As described hereinabove with respect to FIG. 2B, the application of molten solder to a pre-plated terminal causes melting and fusing of the third layer 240 and a portion of the second layer 230. The melting of the third layer 240 and a portion of the second layer 230 tends to fill-in any breaks in (at least) the second layer 230B and the first layer 220 of a terminal, such that Sn in the solder finish is blocked from direct contact with the base material (e.g., Cu) of the terminal (which prevents dendrite formation on the terminal). Flow 400 continues at operation 480.

In operation 480, the singulated assembly can be electrically tested and visually inspected. Defective units can be culled and acceptable units can be passed for further processing. Flow 400 continues at operation 490.

In operation 490, the accepted units can be packaged for shipping as products for extended lifetimes in a wide range of operating environments.

Modifications are possible in the described embodiments, and other embodiments are possible, within the scope of the claims.

What is claimed is:

1. An apparatus, comprising:
   a terminal including a base material;
   a plating stack arranged on a surface of the base material, wherein the plating stack includes breaks in the plating stack that extend from a first surface of the plating stack to a second surface of the plating stack that is arranged adjacent to the surface of the base material; and
   a solder finish coated over the breaks in the plating stack.

2. The apparatus of claim 1, wherein the plating stack includes a first layer for reducing intermetallic reactions involving the base material, a second layer for increasing bonding adhesion of a wire bonded to the terminal, and a third layer for reducing chemical reactions with environmental reactants.

3. The apparatus of claim 1, wherein the plating stack includes a first layer including nickel (Ni) arranged adjacent to base material, a second layer including palladium (Pd) arranged adjacent to the first layer, and a third layer including gold (Au) arranged adjacent to the second layer.

4. The apparatus of claim 3, wherein at least one of the breaks is arranged adjacent to or on a bend in the terminal.

5. The apparatus of claim 4, wherein the at least one of the breaks is formed in response to forces applied for forming the bend in the terminal.

6. The apparatus of claim 3, wherein at least one of the breaks is formed in response to cutting a leadframe dam-bar connected to the terminal.

7. The apparatus of claim 3, wherein the solder finish is arranged for coating the plating stack in response to a dipping operation.

8. The apparatus of claim 3, wherein the solder finish is arranged for coating the plating stack in response to a chemical vapor operation.

9. The apparatus of claim 3, wherein the solder finish is arranged for coating the plating stack in response to an immersion operation.

10. The apparatus of claim 3, wherein gold of the third layer is melted and mixed with the solder finish.

11. The apparatus of claim 10, wherein palladium of the second layer is melted and mixed with the solder finish.

12. The apparatus of claim 11, wherein a portion of the second layer prevents the solder finish from mixing with the first layer.

13. A system, comprising:
   an encapsulate;
   an integrated circuit die arranged within the encapsulate; and
   terminals electrically coupled to the integrated circuit die, wherein a surface of a base material of the terminals is coated with a plating stack, wherein each of the terminals includes an internal portion and an external portion, wherein the internal portion is covered by the encapsulate and the external portion extends outwards from the encapsulate, wherein the external portion of the terminals includes breaks in the plating stack, wherein each break extends from a first surface of the plating stack to a second surface of the plating stack that is arranged adjacent to the surface of the base material, and wherein the external portion of the terminals includes a solder finish coated over the first surface of the plating stack and the breaks in the plating stack.

14. The system of claim 13, wherein the plating stack includes a first layer including nickel (Ni) arranged adjacent to base material, a second layer including palladium (Pd) arranged adjacent to the first layer, and a third layer including gold (Au) arranged adjacent to the second layer.

15. The system of claim 14, wherein at least one of the breaks is arranged adjacent to a bend in the terminal.

16. The system of claim 15, wherein gold of the third layer is melted and mixed with the solder finish, wherein palladium of the second layer is melted and mixed with the solder finish, and wherein a portion of the second layer prevents the solder finish from mixing with the first layer.

17. A method, comprising:
receiving terminals captivated in a leadframe, wherein a surface of a base material of the leadframe is coated with a plating stack, wherein the plating stack includes a first layer including nickel (Ni) arranged adjacent to or in contact with base material, a second layer including palladium (Pd) arranged adjacent to the first layer, and a third layer including gold (Au) arranged adjacent to or in contact with the second layer;
forming the terminals, wherein the formed terminals include breaks extending from the first layer of the plating stack to the third layer of the plating stack; and
coating a solder finish over the third layer of the plating stack, wherein the solder finish is coated over the breaks in the plating stack.

18. The method of claim 17, wherein the forming the terminals includes bending of the terminals, and wherein each of the breaks in the plating stack is adjacent to a respective bend of each terminal.

19. The method of claim 18, further comprising:
coupling integrated circuit dies to the leadframe;
covering each integrated circuit die; and
singulating the covered integrated circuit dies by severing portions of the leadframe, wherein the covered integrated circuit dies are singulated after the solder finish is coated over the third layer of the plating stack.

20. The method of claim 18, further comprising:
coupling an integrated circuit die to the leadframe; and
coupling the integrated circuit die to a printed circuit board, wherein terminals coupled to the integrated circuit die are further coupled to the printed circuit board via a solder joint, wherein the integrated circuit die is coupled to the printed circuit board after the solder finish is coated over the third layer of the plating stack.

* * * * *